United States Patent [19]

Schmidt et al.

[11] Patent Number: 5,871,325
[45] Date of Patent: Feb. 16, 1999

[54] THIN SUPPORT FOR PC BOARD TRANSFER SYSTEM

[75] Inventors: Ronald P. Schmidt; Richard J Van.Every, both of St. Petersburg, Fla.

[73] Assignee: Jabil Circuit, Inc., St. Petersburg, Fla.

[21] Appl. No.: 934,149

[22] Filed: Sep. 23, 1997

Related U.S. Application Data

[63] Continuation of Ser. No. 439,077, May 11, 1995, abandoned, which is a continuation-in-part of Ser. No. 424,671, Apr. 19, 1995, abandoned.

[51] Int. Cl.⁶ ........................................................ F27B 9/24

[52] U.S. Cl. .................... 414/150; 432/121; 414/157; 414/196; 198/817

[58] Field of Search ................... 414/150, 156–159, 414/172, 196; 198/726, 735.1, 817; 432/121, 239, 253, 259

[56] References Cited

U.S. PATENT DOCUMENTS

| | | | |
|---|---|---|---|
| 4,754,867 | 7/1988 | De Anda | 198/817 X |
| 5,267,853 | 12/1993 | Arai | 414/157 X |
| 5,334,014 | 8/1994 | Orbeck et al. | 432/121 |
| 5,511,651 | 4/1996 | Barth | 198/817 |
| 5,628,605 | 5/1997 | Miyoshi | 198/817 X |
| 5,647,740 | 7/1997 | Kobaru | 432/121 X |
| 5,653,586 | 8/1997 | Arai et al. | 432/121 |

*Primary Examiner*—James W. Keenan

[57] ABSTRACT

A transfer system that supports circuit boards as it conveys them through a reflow oven. The system uses a sag support between edge supports. The sag support does not have to move as the circuit board is transferred along the transfer system. The height of the sag support can be easily adjusted. The sag support's mounts can maintain appropriate tension in the sag support even if the sag support expands during operation. The system may use a mechanism to prevent the friction between the boards and the sag support from interfering with the movement of boards along the transfer system.

20 Claims, 8 Drawing Sheets

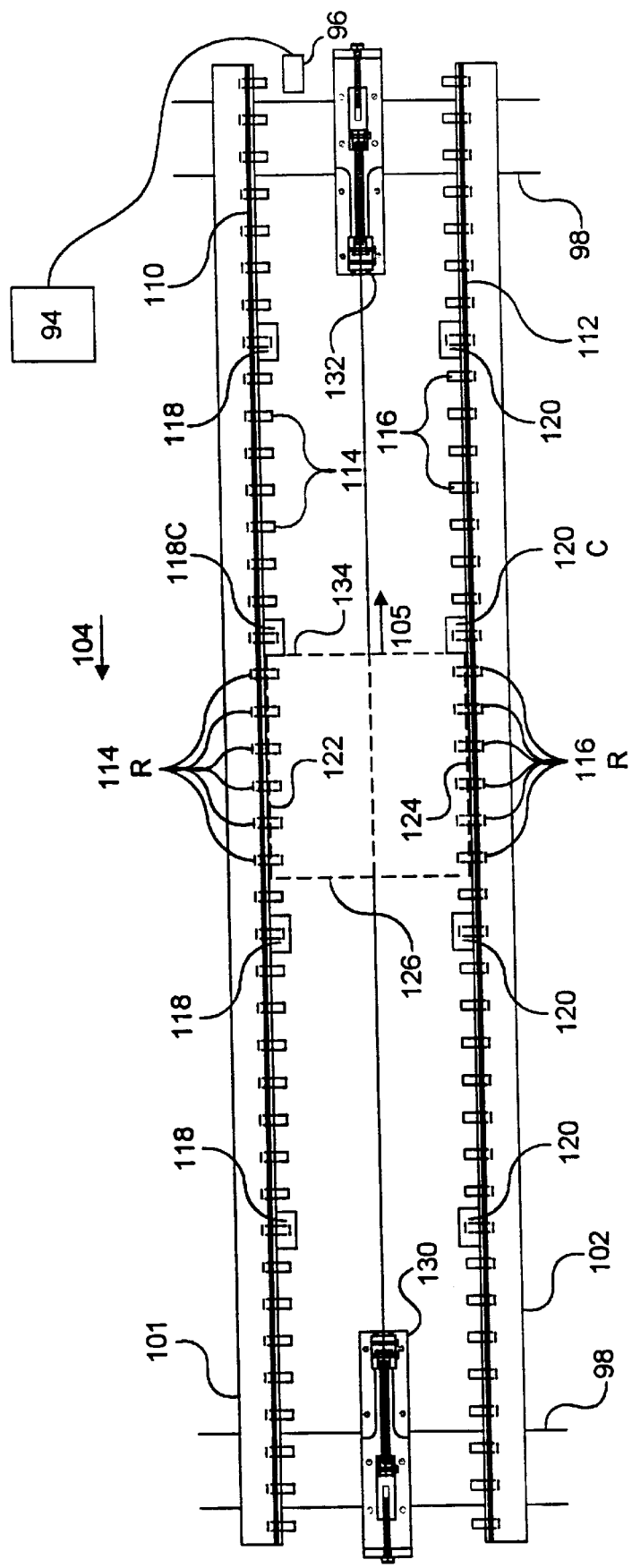

THIN SUPPORT FOR PC BOARD TRANSFER SYSTEM

This application is a continuation of U.S. patent application Ser. No. 08/439,077, filed May 11, 1995, in the names of Ronald P. Schmidt and Richard J. Van Every, now abandoned; which is a continuation-in-part of U.S. patent application Ser. No. 08/424,671, filed in the U.S. Patent and Trademark Office in the names of Ronald P. Schmidt and Richard J. Van Every on Apr. 19, 1995, entitled THIN SUPPORT FOR PC BOARD TRANSFER SYSTEM, and now abandoned.

BACKGROUND OF THE INVENTION

1. Field of the Invention

The invention relates generally to an apparatus for supporting printed circuit boards during manufacture and, more particularly, to a thin support for supporting boards as they are transferred through inline pass through ovens.

2. Description of Related Art

Inline pass through ovens are often used to manufacture printed circuit boards. Such ovens have been used, for example, to solder surface mount devices to a board or to cure adhesives securing components to a board. Typically, to solder surface mount devices, solder paste is screen printed onto the circuit board in desired locations. The surface mount components are then appropriately placed in the solder paste. A part of the oven called a transfer system, typically supports the "parallel edges" of the board while it conveys the board through the oven. The inline pass through oven heats the board and solder, soldering the components to the board. "Parallel edges" refers to the edges of a printed circuit board that are basically parallel to direction that the transfer system moves the circuit board. Inline pass through ovens that solder components are often called reflow ovens.

Some conventional transfer systems support the "parallel edges" of a printed circuit board with what we will call "edge supports. " An edge support may comprise support rails, chains and pins extending from the chains. Support rails such as these have been used in ovens and transfer systems manufactured by a company called Research Incorporated, located in Minneapolis, Minn., for example.

Edge supports are typically constructed by fixing support rails to a frame of the pass through oven. Chains typically rotate through these support rails, and pins typically extend from these chains such that a printed circuit board can rest on the pins. The pins typically extend 0.1–0.2 inch beneath the circuit board's parallel edges. As the chains rotate through the support rails, they move the pins such that the chains and pins carry circuit boards through the oven. We will refer to the process of conveying a board along a manufacturing line (e.g. through an oven) as "transferring" the board.

Reflow ovens typically use a specific thermal profile to solder components. For example, a reflow oven may have 4 or more temperature zones through which the board travels. The first 4 or 5 zones, for example, typically bring a board up to a desired temperature in a controlled manner. The final zone, called a spike zone, rapidly brings the board up to reflow temperatures, typically in the range of 183°–210° Celsius, soldering the components to the board. Inline pass through ovens used for purposes other than solder reflow often operate in a similar manner, but may use different thermal profiles.

The transfer systems used with some conventional inline pass through ovens support only the parallel edges of the printed circuit boards. Depending upon the weight of the components on a printed circuit board and/or the thickness of the board, however, the elevated thermal profile used with reflow or other types of inline pass through ovens may cause the circuit board to sag. Sagging can occur because boards, sometimes made of epoxy-glass laminates, may go through a glass transition phase and become weak at certain temperatures. For example, a widely available epoxy-glass laminate that has been used in printed circuit boards, FR4, typically has a transition phase around 150° C. Generally, the higher the temperature above this transition temperature, the weaker a board becomes. Sagging can result in warped boards that may not fit into their final assembly. It can result in open solder joints because the solder cannot bridge the gap between the component and the warped board. Extreme warping can result in boards falling off the transfer system. Accordingly, parallel edge support, alone, may be adequate for some rigid printed circuit boards, but additional support may be required to control sagging of thin printed circuit boards or printed circuit boards with heavy components.

Conventional approaches to preventing sagging have added a dynamic or moving support between the edge supports. One conventional approach has used a steel cable to provide this additional support. This approach attaches the cable to a drive system. The cable's drive system causes the cable to move with the chains and pins of the edge supports as they carry the board through the oven.

Steel cable, however, has an inherent tendency to sag from its own weight. To insure a straight support surface, this approach must apply a high tensile force to the cable. Additionally, because of space constraints, the drive system may force the cable through tight radii. Tight radii in a dynamic system combined with the high tensile force can accelerate cable fatigue and failure. Accordingly, conventional dynamic steel cable systems have failed to provide an optimum solution to the sagging problem.

Another conventional approach to preventing sagging adds a support rail and roller chain between the edge supports. Further, the thermal characteristics of the rail and chain can affect the heating of the board. In fact, conventional systems have employed methods for heating support rails to prevent heating problems caused by the thermal characteristics of such rails. Such heating methods potentially add even further cost and complexity to the system. An additional rail and roller chain between the edge supports can also limit printed circuit board layouts by requiring a wide contact area (an area where no components may exist) on the bottom of the circuit board where the roller chain supports the board. Components in this area might be dislodged or damaged by the rail or roller chain. Accordingly, dynamic rail and roller chain systems have also failed to provide an optimum solution to the sagging problem.

There has been a need for a support system that does not have the complexity of conventional dynamic systems. There has been a need for a support system less sensitive to the fatigue or durability problems of conventional dynamic systems. There has been a need for a system that will have minimal impact on printed circuit board layouts and the thermal characteristics of the heating process. There has been a need for a system that prevents sagging using a sag support that does not have to move during transfer. The present invention meets these needs.

SUMMARY OF THE INVENTION

One aspect of the present invention is to provide a simple apparatus for supporting and preventing sag of printed circuit boards. A second aspect of the present invention is to provide an apparatus less sensitive to fatigue or durability problems than conventional dynamic support systems. Another aspect of the present invention is to provide such an apparatus that has minimal impact on the layout of the board. Another aspect of this invention is to provide such an apparatus that has minimal impact on the thermal characteristics of the heating process. A further aspect of the present invention is to provide such an apparatus that uses a sag support to prevent sagging such that the sag support does not have to move during transfer.

BRIEF DESCRIPTION OF THE DRAWINGS

FIG. 1b shows a top view of this support system embodiment and transfer system 100;

DESCRIPTION OF THE PREFERRED EMBODIMENT

The present invention comprises a novel apparatus for supporting a printed circuit board while the board is transferred through an oven. The following description is presented to enable a person skilled in the art to make and use the invention. Descriptions of specific applications are provided only as examples. Various modifications to the described embodiment will be readily apparent to those skilled in the art, and the generic principles defined herein may be applied to other embodiments and applications without departing from the spirit and scope of the invention. Thus, the present invention is not intended to be limited to the described or illustrated embodiments, but should be accorded the widest scope consistent with the principles and features disclosed herein.

Figure 1A:
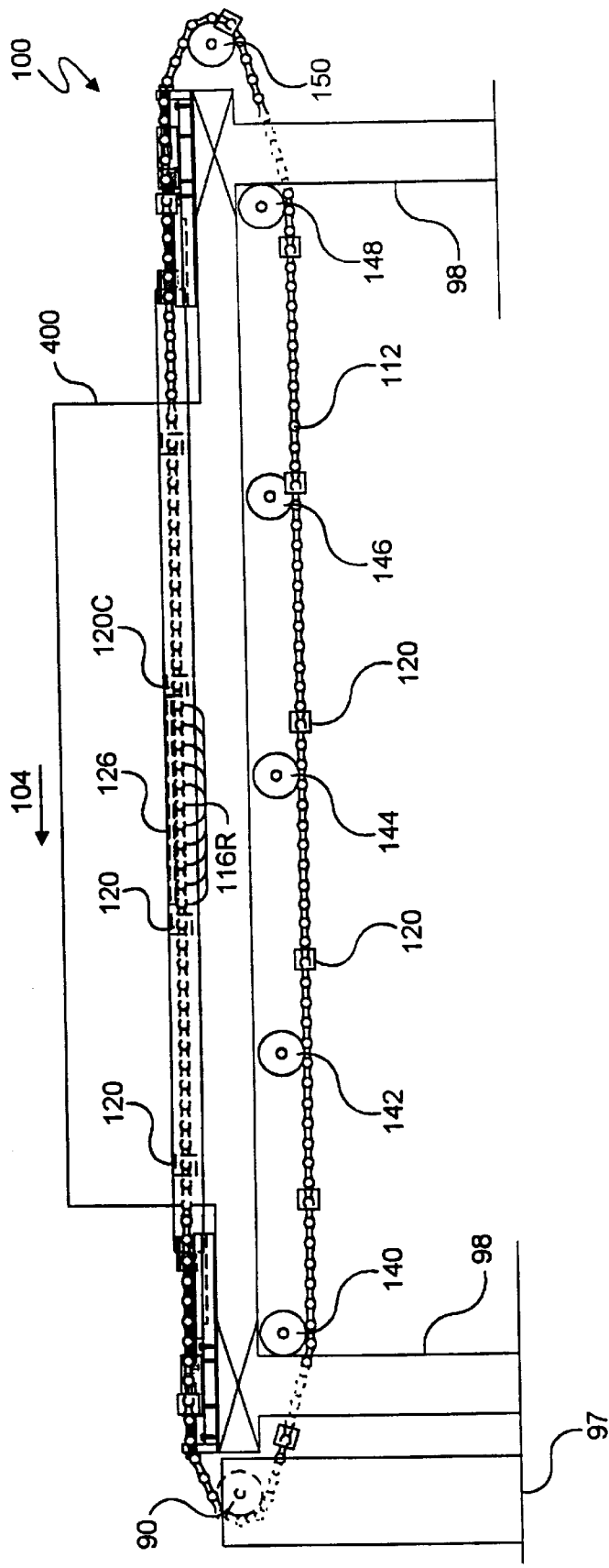
FIG. 1a shows a side view of a support system that is an embodiment of the present invention used in a printed circuit board transfer system 100.

Printed circuit board transfer systems such as transfer system 100, shown in FIGS. 1a and 1b, have been used in ovens manufactured by Research Incorporated, located in Minneapolis, Minn. for example. The support system used with transfer system 100 is an embodiment of the present invention.

Figure 2A:
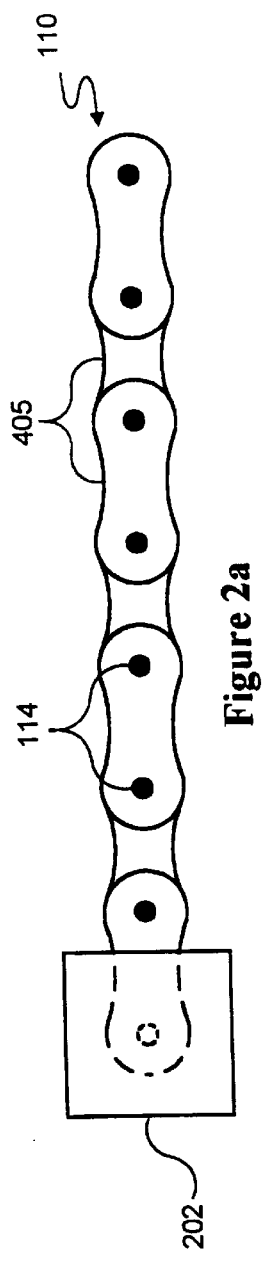
FIGS. 2a–2c show three views of stops used in this support system embodiment that may be mounted to system 100's drive chains.
Figure 2B:
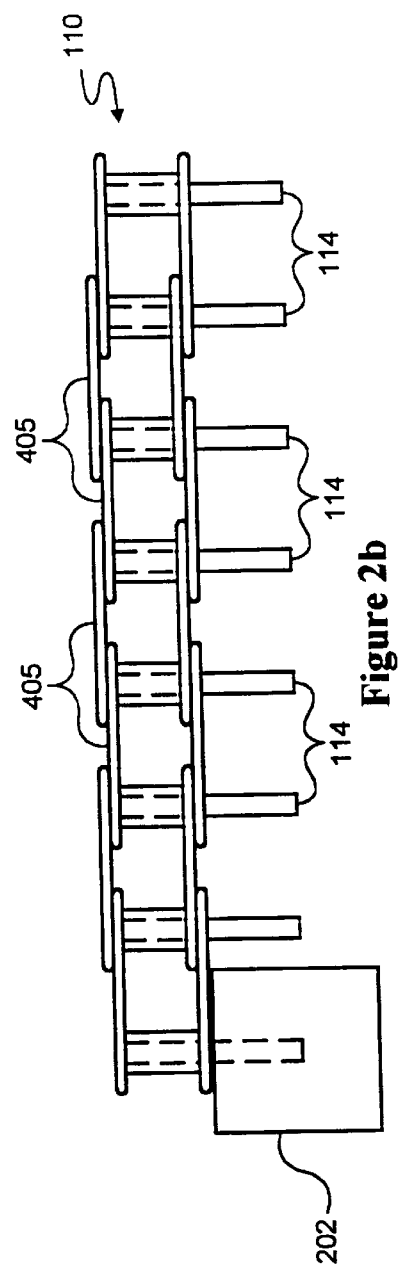
Figure 2C:
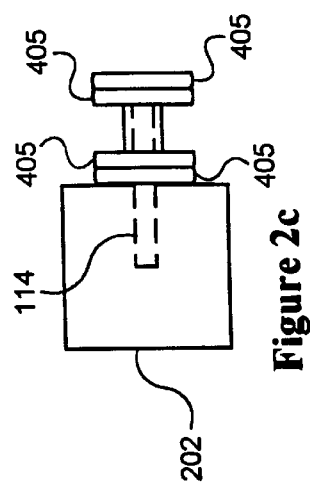

In transfer system 100, support rails 101 and 102 are fixed to the frame 98 of the reflow oven 400. Chains 110 and 112 are mounted through support rails 101 and 102, respectively. Connected to and extending from chains 110 and 112 are a plurality of pins 114 and 116, respectively. Chain 110 and the plurality of pins 114 are illustrated in FIG. 2. In the present transfer system, chain 112 and the plurality of pins 116 can be the same or similar to chain 110 and the plurality of pins 114, respectively. As shown in FIGS. 1a and 1b, circuit board 126 rests on some of these pins such that some of pins 114 and some of pins 116 support parallel edges 122 and 124, respectively, of the circuit board 126. The pins upon which edge 122 of circuit board 126 rests shall be referred to as pins 114R. We will refer to the pins upon which edge 124 of circuit board 126 rests as pins 116R. The "parallel edges" are the edges of the circuit board 126 that are basically parallel to the direction 104, shown in FIGS. 1a and 1b, that the transfer system 100 moves the board 126. The plurality of pins 114 and 116 are typically constructed so that pins 114R and 116R extend 0.1 to 0.2 inch past parallel edges 122 and 124, beneath the circuit board 126. Pins that extend further may be more likely to interfere with the circuit board 126's layout or with the heating of the board as it moves through the reflow oven 400. The "edge supports" of system 100 comprise the support rails 101 and 102, chains 110 and 112 and the plurality of pins 114 and 116. Embodiments of the present invention may be used with transfer systems having different edge supports. Again, an edge support is the part of a transfer system that supports a parallel edge of a board.

The support system, shown in FIGS. 1a and 1b that is an embodiment of the present invention basically comprises sag support mounts 130 and 132, sag support 128, plurality of stops 118 and 120 and feed sensor 96. Sag support mounts 130 and 132 hold sag support 128 between the support rails 101 and 102. While the sag support 128 shown in this figure is a stationary strip of metal, embodiments of the present invention could use a sag support that is capable of moving. "Sag support" refers to any support that does not have to, but could, move to transfer a circuit board along a transfer system. Thus, for example, the sag support could be a wire mounted on pulleys. It could be a stationary wire. Further, while the embodiment of FIGS. 1a and 1b shows a single sag support 128, embodiments of support systems may use more than one sag support. When embodiments use a single sag support, the sag support is preferably centered between the support rails 101 and 102, although the present invention does not require that the sag support 128 be centered.

Figure 4:
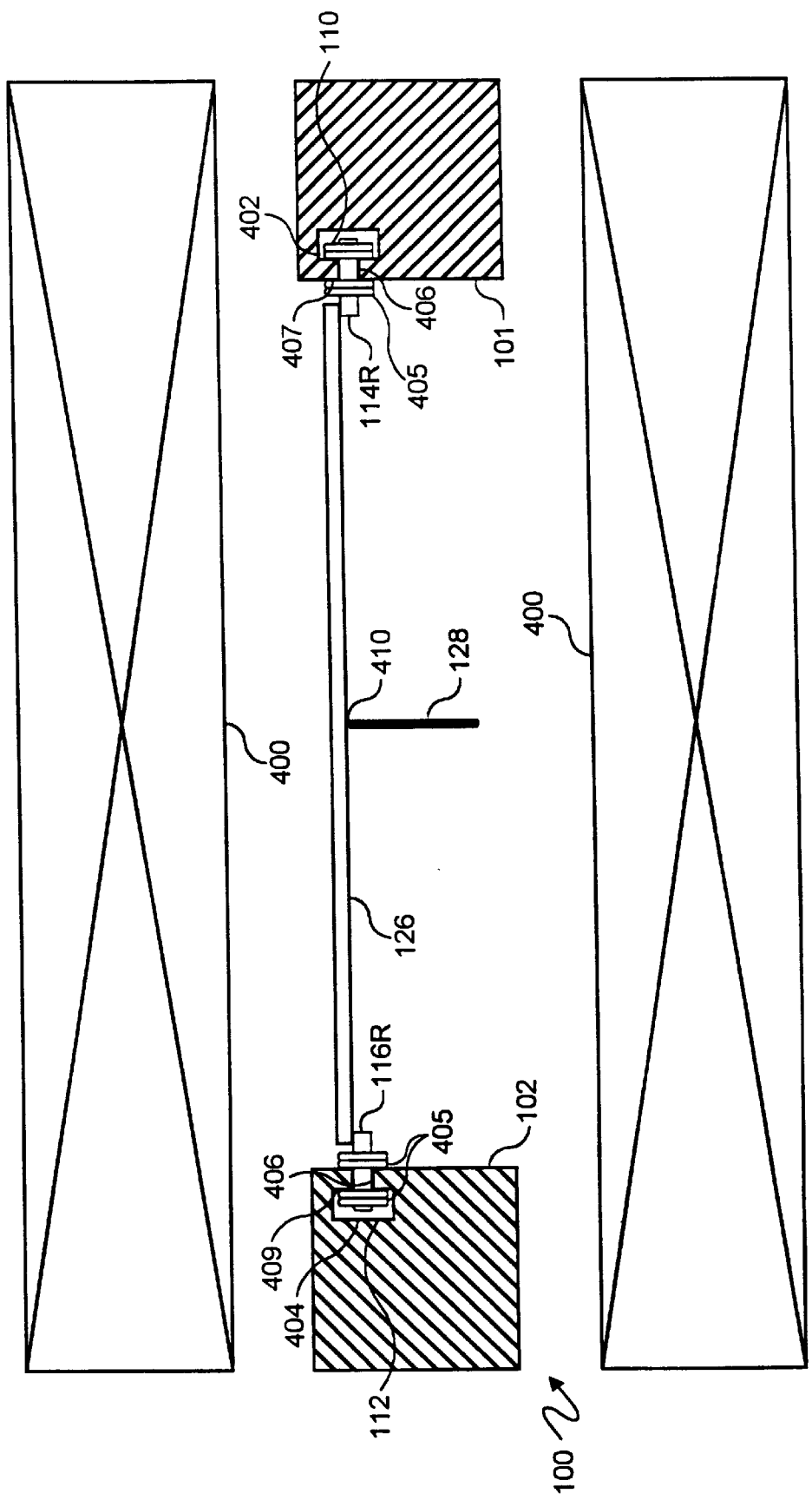
FIG. 4 shows a cross-sectional view of the support system embodiment and transfer system 100.

FIG. 4 shows a cross-sectional view of the support system embodiment and transfer system 100 as used with a reflow oven 400. This figure illustrates groove 402 in support rail 101 and groove 404 in support rail 102. System 100 uses these grooves to route chains 110 and 112 through support rails 101 and 102. FIG. 4 shows a typical shape for these grooves, and it shows how the grooves engage chains 110 and 112. Again, transfer systems such as system 100 are known in the art and have been used with reflow ovens manufactured by Research Incorporated located in Minneapolis, Minn.

As shown in FIG. 4, chains 110 and 112 travel into the page in grooves 402 and 404, respectively. The chains 110 and 112 return in the opposite direction beneath the reflow oven. As demonstrated in FIG. 1a, the return path of the chains 110 and 112 is controlled by chain tensioners such as tensioners 140, 142, 144, 146, 148 and 150.

In FIG. 4, as chains 110 and 112 move into the page in grooves 402 and 404, they move the plurality of pins 114 and 116 into the page. As the plurality of pins 114 and 116 move, the pins 114R and 116R will move or transfer the board 126 into the page unless the friction 105 (shown in FIG. 1b as arrow 105) between the board 126 and the sag support 128 is large enough to prevent them from doing so.

In the circumstance where friction 105 is large enough to prevent the pins 114R and 116R from moving the board 126 in direction 104, embodiments of the invention may use a plurality of stops 118 and 120 to overcome this friction 105. FIGS. 1a and 1b show the plurality of stops 118 and 120. In the preferred embodiment stops are pressed onto pins every 14 inches. Other spacings may be used, however. The spacing preferably corresponds to the length of the longest board that will be transferred by the transfer system.

Stops made of common tool steels have been successfully used with embodiments of the present invention. Embodiments of the present invention could use stops made of other materials, but the stops must withstand the temperatures to which the oven 400 will subject them. In the preferred embodiment, these stops are fixed to some of the plurality of pins 114 and 116 by drilling holes in the stops and pressing the stops onto the pins. FIG. 2 shows a stop 202 pressed onto one of the plurality of pins 114. If stops made of materials other than tool steel are used and they are pressed onto pins, as in the preferred embodiment, the material must be suitable for press fit applications. Embodiments of the present invention are not limited to a particular press fit. As will be appreciated by the person having ordinary skill in the art, the particular press fit may depend on the type of materials used for the stops and the pins. Appropriate press fits for different materials are discussed in known references, such as the Machinery's Handbook. In general, the press fit should prevent the stops from rotating on or sliding off of the pins. It should account for the coefficients of thermal expansion of the materials involved. A class FN2 press fit, defined in the Machinery's Handbook as a 0.020–0.001 inch press fit, has been successfully used.

Where friction 105 prevents pins 114R and 116R from moving board 126 in direction 104, the plurality of pins 114 and 116 and the plurality of stops 118 and 120 will move in direction 104 even if board 126 remains stationary. In particular, some of the plurality of pins 114 and 116 will slide beneath board 126 in direction 104 until stops 118C and 120C contact edge 134 of board 126. At this point, stops 118C and 120C will force board 126 to move in direction 104 on pins 114R and 116R, overcoming friction 105. Other techniques may be used to prevent the friction 105 from interfering with board transfer. These include, but are not limited to mechanical mechanisms, such as stops 118C and 120C, that force the board 126 to move in spite of the friction. Other embodiments might use stops on only one side of the transfer system. Embodiments of the present invention could knurl some or all of the plurality of pins 114 and/or 116 to increase friction between the pins and the board 126 sufficiently to overcome friction 105. Under such circumstances, because of the friction between the board and the pins, the movement of the pins in direction 104 will typically move the board 126 in direction 104 in spite of friction 105. Such an embodiment may simplify the process of feeding boards to the transfer system because the upstream assembly equipment may not need to keep track of the location of the plurality of stops 118 and 120. Embodiments of the present invention may increase friction between some or all of pins 114 and/or 116 using any other technique that works with the assembly process.

Determining the optimum material and dimensions of sag support 128 for a particular application may require a balancing of a number of factors. A sag support 128 made of blued spring steel, having a width of 0.01 inch and a height of 1 inch is preferred because it provides a good balance of factors, including cost, durability, strength and thermal characteristics. Other materials and dimensions may be used, however.

Minimizing the width of support 128 may be desirable because a thin width can reduce the friction 105 between the sag support 128 and the board 126. Minimizing this friction 105 is not critical in the support system embodiment used with transfer system 100, however, because this support system uses the stops 118C and 120C to assure that friction 105 does not prevent the pins 114R and 116R from moving the board 126.

Minimizing the width of stationary support 128 is also desirable to reduce its affect on board 126's layout. A thin stationary support 128 will have less contact area with the bottom of the board 126. The contact area is the area where the sag support 128 could contact the bottom of the board 126. Minimizing this contact area is important because the board 126 typically cannot have components in this contact area. Components in this area may be damaged or dislodged by the support 128.

It is preferable to minimize the thermal effect that sag support 128 has on heating the board 126 by reducing its mass. The strip of blued spring steel used in the preferred embodiment, having a 0.01 inch width and 1 inch height has worked well in actual use. Other dimensions may be used, however, but they must be sufficient to withstand the physical demands of the system. For example, sag support 128's dimensions should not be reduced to the extent that the support 128 may break during operation. Also, reducing the height of sag support 128 may increase the tendency of support 128 to bow during heating. This may require that the sag support mounts 130 and 132 apply increased tension to support 128. Alternatively, bowing may be controlled by an intermediate support or supports placed along the length of sag support 128.

The thermal effect of support 128 might also be reduced by making the support 128 out of different materials. The support 128 might be made out of aluminum, for example. Aluminum may have a greater tendency than steel to stretch or even break, however. The sag support 128 might be made of titanium, but this may increase cost. Choosing an optimum material may also depend upon how the material will affect the friction 105 between the support 128 and the board 126.

In the embodiment shown in FIG. 4, support 128 is arranged so that its support edge 410 is horizontally aligned in a plane substantially formed by the pins 114R and 116R. This position of support 128 is preferred because it will ideally prevent or minimize circuit board sag. Support 128 could alternatively be arranged so that its support edge 410 is below this plane. Such positioning may reduce the friction between the support 128 and the board 126. The FIG. 4 embodiment horizontally aligns this edge in the plane, however, and uses stops 118C and 120C to eliminate or reduce friction concerns. Support edge 410 could be adjusted to be above the plane substantially formed by the pins 114R and 116R, although such positioning will usually be undesirable. FIG. 1a, in fact, shows edge 410 above the pins 114R and 116R. This depiction is for illustrative convenience, however. The alignment shown in FIG. 4 is preferred.

Figure 3A:
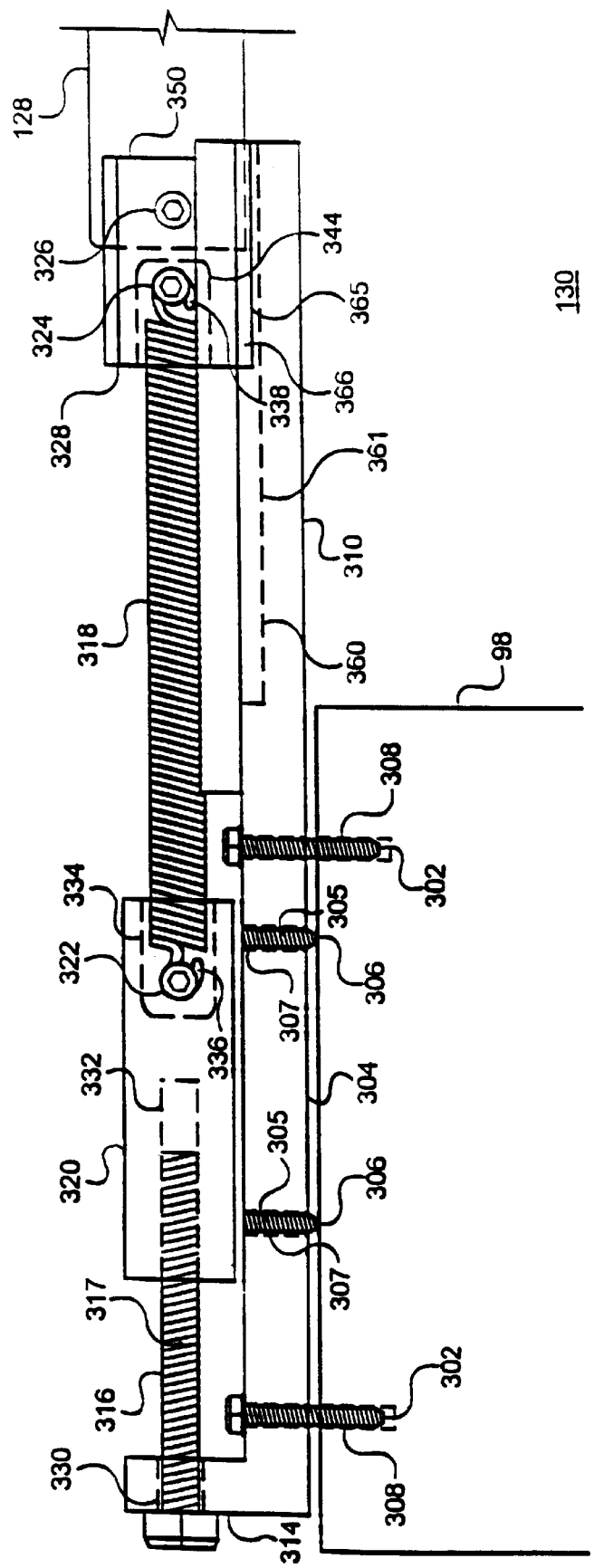
FIG. 3a shows an expanded side view of a sag support mount that may be used in embodiments of the present invention.

As shown in FIGS. 1a and 1b, support mounts 130 and 132 are also mounted to the frame 98 of the oven 400. These support mounts hold sag support 128 in the desired position. FIG. 3a shows an expanded side view and FIG. 3b an expanded top view of support mount 130. The invention does not require these particular support mounts. In fact, it does not require support mounts at all. All that is required is some method of positioning the sag support 128 so that it can prevent circuit board sagging according to the present invention. Support mount 132 is preferably, but need not be, identical to support mount 130.

Support mount 130 has a base 304 on which the rest of the support mount 130 is constructed. Mounting bolts 302 extend through holes 308 in base 304 and are used to mount the base 304 to the frame 98. In addition to frame 98, these bolts 302 could be used to mount the base 304 to any surface appropriate to enable the support mounts 130 and 132 to properly hold sag support 128. Further, while base 304 is mounted to frame 98 using bolts 302, it could be attached using any technique that will sufficiently secure it to the frame. It is not limited to any of the described mounting techniques.

The base 304 of support mount 130 has successfully been made of aluminum. It could also be made of steel, plastic, wood or other materials. In the described embodiment, the oven 400 does not apply heat to the support mounts 130 and 132. All that is needed is a material with sufficient rigidity to hold sag support 128 so that it can support circuit boards.

As shown in FIG. 3a, height adjustment screws 306 are preferably threaded into holes 307 in base 304. That is, the threads 305 of screws 306 preferably engage the base 304 as screws 306 extend through holes 307. Screws 306 also preferably extend beyond the bottom surface 310 of base 304 when height adjustment is necessary or desired. Accordingly, when mounting bolts 302 are tightened to secure the base 304 to frame 98, the support mount 130 preferably rests on height adjustment screws 306 rather than on bottom surface 310. These height adjustment screws enable adjustment of the support mount 130's height or vertical position. Thus, these screws can be used to horizontally align the support edge 410 of sag support 128 as desired. In a preferred embodiment, they are used to align support edge 410 with the plane substantially formed by the pins 114R and 116R. These screws can also be used to properly adjust the height of sag support 128 if a support system is used with different ovens. Because the screws 306 are individually adjustable, they also enable levelling of support mount 130. If no height adjustment or levelling is necessary or desired, the height adjustment screws 306 could be adjusted so the bottom surface 310 of the base 304 rests directly on frame 98. In fact, the support mounts 130 and 132 need not have height adjustment screws at all. The screws 306 could be eliminated altogether.

As shown in FIG. 3a, base 304 of support mount 130 has an extension 314 at one end that extends substantially perpendicular to the bottom surface 310. In support mount 130, tensioning screw 316, block 320, spring 318 and spring guide 328 are connected in series from extension 314 to sag support 128 to provide a mechanism for adjusting and maintaining the tension in the sag support 128. Support mount 132 preferably has a similar tensioning mechanism. Other support systems that embody the present invention may or may not provide a mechanism for adjustable tension. Depending on the structure of sag support 128, such as its dimensions and material composition, for example, the sag support 128 may not require any tension to support a printed circuit board. The described embodiment requires some tension however, and the preferred tension is determined by adjusting the tension adjusting screw 316 until sag support 128 provides a level surface to support the circuit board 126. The tension adjusting screw 316, then is preferably tightened further so that the support mounts 130 and 132 maintain sufficient tension on sag support 128 to provide a level surface even if sag support 128 expands due to heating.

Figure 3B:
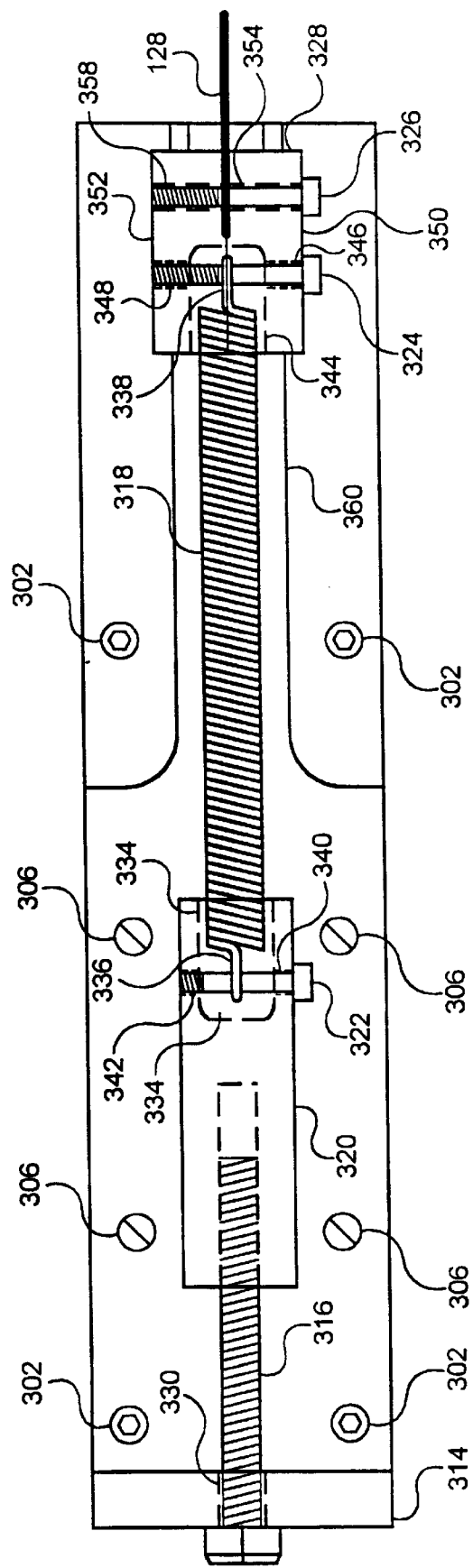
FIG. 3b shows an expanded top view of a sag support mount that may be used in embodiments of the present invention.

As shown in support mount 130 of FIGS. 3a and 3b, the series connection between extension 314, tension screw 316, block 320, spring 318, spring guide 328 and sag support 128 is formed as follows. Tension screw 316 extends through hole 330 in extension 314. The threads 317 of screw 316 preferably do not engage the extension 314. Screw 316 is threaded into block 320. That is, threads 317 of screw 316 engage block 320 as screw 316 extends into hole 332.

Spring 318 has spring hooks 336 and 338 at its opposite ends. Spring 318 connects to block 320 by extending spring hook 336 into recess 334 of block 320, extending bolt 322 through hole 340 and through recess 334. Bolt 322 engages spring hook 336 as the bolt passes through recess 334. Bolt 322 is then threaded into hole 342.

Spring hook 338 is connected to spring guide 328 in a similar manner. In this case, however, spring guide 328 comprises two pieces: a portion 350 and a portion 352, illustrated in FIG. 3d, 3e and 3f. Recess 344 is formed by joining together portions 350 and 352 of spring guide 328. In particular, bolt 324 extends through hole 346 and through the portion of recess 344 formed in portion 350. Bolt 324 next engages spring hook 338. It then threads into hole 348, completing the connection of spring 318 to spring guide 328 and helping to hold together portions 350 and 352 of spring guide 328.

Figure 3C:
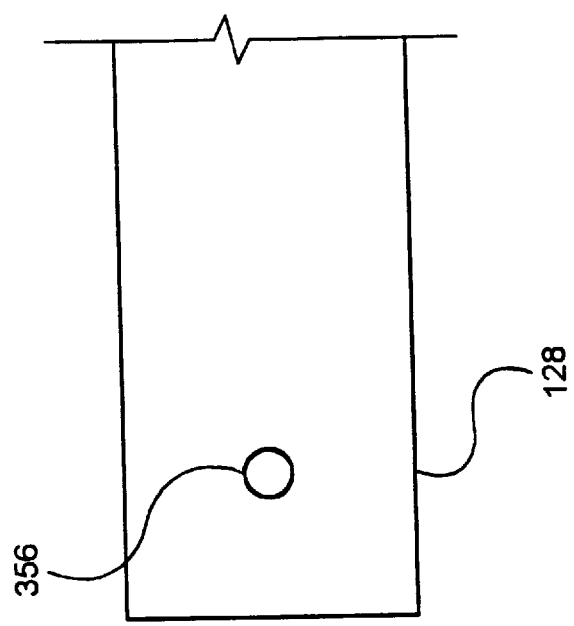
FIG. 3c shows a side view of an unconnected end of a sag support that may be used in embodiments of the present invention.

Sag support 128 is connected to spring guide 328 by connecting support 128 between portions 350 and 352, as follows. Bolt 326 extends through hole 354 in portion 350 and through hole 356 in sag support 128. FIG. 3c illustrates an unconnected end of sag support 128 having hole 356. After extending through hole 356 in support 128, screw 326 is threaded into hole 358 of portion 352, securing sag support 128 between portions 350 and 352 of spring guide 328.

This series of connections from extension 314, to tension adjustment screw 316, to block 320, to spring 318, to spring guide 328, to stationary support 128 creates a mechanism on support mounts 130 and 132 by which the tension of sag support 128 can be adjusted as desired. To increase the tension in sag support 128 tensioning screw 316 can be threaded further into block 320. Doing so will pull block 320 closer to extension 314 and spring hook 336 closer to extension 314, increasing the distance that the spring 318 is extended. By increasing this distance, the force or tension that spring 318 applies to stationary support 128 through spring guide 328 is increased. Unthreading tensioning screw 316 from block 320 will have the opposite effect. It will reduce the tension in sag support 128. In this manner, support mounts 130 and 132 hold sag support 128 with an adjustable tension at both ends.

Spring guide 328 prevents spring 316 from moving in a direction perpendicular to sag support 128 without interfering with the tensioning process. In particular, as shown in FIGS. 3a and 3b, base 304 of support mount 130 has a guide groove 360 formed in it. This groove can be formed in base 304 in any manner known in the art. For example, if base 304 is made of aluminum, the guide groove 360 could be machined into base 304 using a technique known in the art. If the base 304 is made of plastic, the guide groove 360 could be molded into base 304.

Figure 3F:
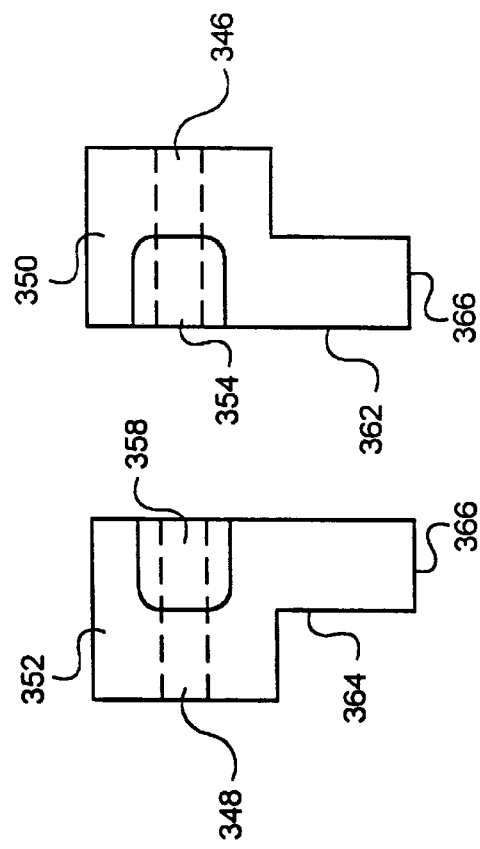
FIGS. 3d, 3e and 3f show respective top, side and front views of a spring guide that may be used in embodiments of the present invention.
Figure 3E:
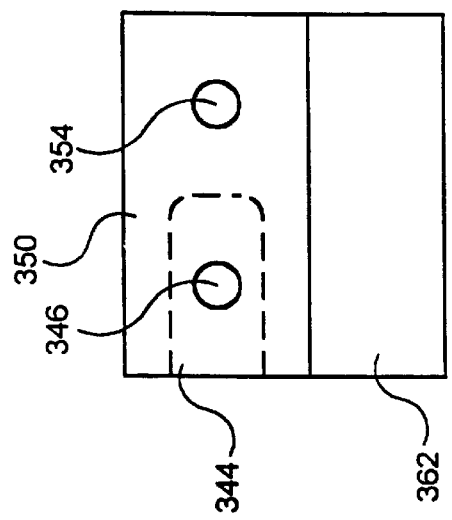
Figure 3D:
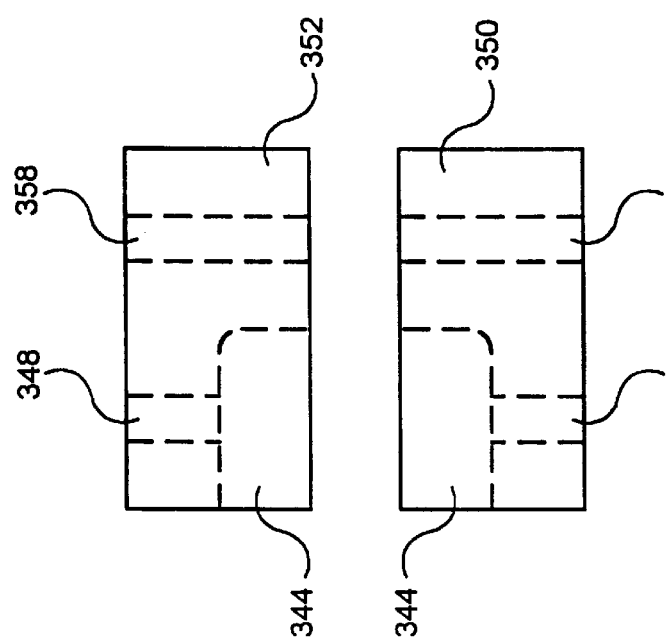

As shown in FIG. 3f, portion 350 of spring guide 328 has a guide extension 362. Portion 352 of spring guide 328 has a guide extension 364. When the portions 350 and 352 of spring guide 328 are connected together, as described, guide extensions 362 and 364 form a guide 366. This guide 366 slidably engages-guide groove 360 when spring guide 328 is mounted in support mount 130. A loose running fit, ANSI RC8 or RC9, has been successfully used with the present invention. As shown in FIG. 3a, the surface 365 of guide 366 rests and moves on surface 361 of the base 304. By slidably engaging groove 360, this guide 366 enables spring guide 328 to prevent spring 316 from moving in a direction perpendicular to sag support 128 without interfering with the tensioning of support 128.

As shown in FIG. 1a, the transfer system 100 uses a drive mechanism 97 to move the chains 110 and 112 through the support rails 101 and 102. Drive mechanisms such as these are known in the art and have been used with ovens made by Research Incorporated, for example. Drive mechanism 97 engages and moves chains 110 and 112 in a manner known in the art. The drive mechanism 97 is chosen such that the plurality of stops 118 and 120 do not interfere with the drive mechanism. It is not difficult to choose such a drive mechanism because the stops are pressed onto pins on the side of the chain and the gears or sprockets that drive the chain, such as sprocket 90, engage the chain between the links 405. Again, drives used with ovens and transfer systems made by Research Incorporated have been successfully used with embodiments of the present invention.

In a typical manufacturing process, printed circuit boards might be provided to the transfer system 100 by upstream assembly equipment. For example, conveyors transfer a board from station to station through the assembly process until they reach transfer system 100. Accordingly, board 126 may be provided to transfer system 100 by an upstream conveyor. A programmable logic system 94 and a sensor 96 control the movement of the conveyor that transfers boards to the transfer system 100.

Transfer system 100 typically runs at a constant speed. Accordingly, chains 110 and 112, the plurality of pins 114 and 116 and the plurality of stops 118 and 120 will be moving in direction 104, as shown in FIGS. 1a and 1b. In the preferred embodiment, sensor 96 senses the position of the plurality of stops 118 or 120. It provides a signal to an input of the programmable logic system 94. The programmable logic system 94 responds to the sensor's signal by turning the conveyor that feeds the transfer system 100 on and off at appropriate times. In this manner the programmable logic system 94 and the sensor 96 control the movement of the conveyor feeding the transfer system 100 so that it feeds boards to transfer system 100 onto pins between the plurality of stops 118 or 120. Such sensors and programmable logic systems are known in the art. Such sensors might include, but are not limited to magnetic or optical sensors, for example. An optical sensor manufactured by Kaynes has been successfully used. As will be appreciated by the person having ordinary skill in the art, other types of control or control systems could be used to start and stop the line based on sensed information. Embodiments of the present invention need not use this particular approach to feeding boards to transfer system 100. They can use any approach that works.

In the described embodiment, a conveyor transfers circuit board 126 onto pins 114R and 116R. Sag support 128 prevents or minimizes board sag. The pins 114R and 116R will move board 126 in direction 104, unless the friction 105 between board 126 and sag support 128 prevents them from doing so. If friction 105 prevents board 126 from properly moving in direction 104, the chains 110 and 112, the plurality of pins 114 and 116, and the plurality of stops 118 and 120 will still move in that direction. In this circumstance, the plurality of pins 114 and 116 will slide beneath board 126 in direction 104 until stop 118C and stop 120C contact edge 134 of board 126. At this point, the stops will engage the board's edge 134, overcoming the friction 105 between board 126 and sag support 128 and moving board 126 in direction 104.

While the invention has been described in terms of what is presently considered to be the preferred embodiment, the invention is not limited to or by the disclosed embodiment. The person of ordinary skill will readily appreciate that the invention can be applied beyond the particular systems mentioned as examples in this specification. The invention comprises all embodiments within the scope of the appended claims and/or supported by the disclosure.

What is claimed is:

1. A support system for supporting a circuit board, the circuit board adapted to move through an interior heating region of an inline pass through oven, the support system comprising:

a sag support positioned with respect to the circuit board to prevent a first area of the circuit board from sagging with respect to a second area of the circuit board as the circuit board moves through the interior heating region of the inline pass through oven, such that the sag support does not actively transfer the circuit board through the oven;

at least one frame;

a first support mount coupled to the sag support and coupled to the at least one frame;

a second support mount coupled to the sag support and coupled to the at least one frame; the first and second support mounts coupled to the at least one frame to position the sag support for preventing the first area of the circuit board from sagging with respect to the second area of the circuit board; at least one of the support mounts including a support base and a tensioner, the support base coupled to the at least one frame to fix the at least one support mount with respect to the circuit board, the tensioner coupled to the support base and to the sag support, the tensioner maintaining an adjustable tension on the sag support;

a first edge support including a first transfer mechanism, the first edge support fixed to the at least one frame, the first edge support and the first transfer mechanism passing through the interior heating region of the inline pass through oven, the first transfer mechanism adapted to support a first edge of the circuit board; and a second edge support including a second transfer mechanism, the second edge support fixed to the at least one frame, the second edge support and the second transfer mechanism passing through the interior heating region of the inline pass through oven, the second transfer mechanism adapted to support a second edge of the circuit board, and the first and second transfer mechanisms adapted to transfer the circuit board through the inline pass through oven.

2. The support system of claim 1, wherein the first and second support mounts position the sag support between the first and second edge supports.

3. The system of claim 2, wherein the sag support is centered between the edge supports.

4. The support system of claim 1, wherein each edge support comprises:

a support rail fixed to the at least one frame such that the support rail passes through the interior heating region of the inline pass through oven;

a chain movably engaging the support rail to form the transfer mechanism in the respective edge support;

a plurality of pins connected to the chain and extending from the chain beneath the circuit board to provide the respective transfer mechanism support of the circuit board.

5. The support system of claim 4, wherein at least one of the pins has a knurl to provide friction between the circuit board and the at least one pin.

6. The support system of claim 4, further comprising:
a plurality of stops fixed to at least one of the first and second transfer mechanisms such that the stops are adapted to engage the circuit board and to push the circuit board through the interior heating region of the inline pass through oven.

7. The support system of claim 6, wherein the plurality of stops have holes and each stop is pressed onto one of the pins to fix each stop to the at least one of the first and second transfer mechanisms.

8. The support system of claim 4, wherein the sag support comprises a support edge and wherein the support edge is positioned beneath the circuit board in alignment with the plurality of pins to prevent the first area of the circuit board from sagging with respect to the second area of the circuit board.

9. The support system of claim 4, wherein the sag support comprises a support edge and wherein the support edge is positioned beneath the circuit board below the plurality of pins to prevent the first area of the circuit board from sagging with respect to the second area of the circuit board.

10. The support system of claim 1, further comprising:
a plurality of stops fixed to at least one of the first and second transfer mechanisms such that the stops are adapted to engage the circuit board and to push the circuit board through the interior heating region of the inline pass through oven.

11. A support system for supporting a circuit board, the circuit board adapted to move through an interior heating region of an inline pass through oven, the support system comprising:
a sag support that passes through the interior heating region of the inline pass through oven, the sag support positioned with respect to the circuit board to prevent a first area of the circuit board from sagging with respect to a second area of the circuit board as the circuit board moves through the interior heating region of the inline pass through oven, such that the sag support does not actively transfer the circuit board through the oven:
a first support mount coupled to the sag support and coupled to a first surface that is fixed with respect to the circuit board;
a second support mount coupled to the sag support and coupled to a second surface that is fixed with respect to the circuit board; the first and the second support mounts are fixed to the first and second surfaces to position the sag support with respect to the circuit board such that the sag support can prevent the first area of the circuit board from sagging with respect to the second area of the circuit board;
a first height adjusting mechanism is provided to adjust the position of the first support mount with respect to the first surface;
a second height adjusting mechanism is provided to adjust the position of the second support mount with respect to the second surface; and the first and second height adjusting mechanisms adapted to adjust the position of the sag support with respect to the circuit board by adjusting the position of the support mounts.

12. A transfer system for moving a circuit board, the transfer system comprising:
an inline pass through oven having an interior heating region;
first means for moving the circuit board through the interior heating region of the oven, the first means mounted within the inline pass through oven; and
second means for preventing the circuit board from sagging as the first means moves the circuit board through the interior heating region of the inline pass through oven is the second means does not actively transfer the circuit board through the oven.

13. A method for preventing sagging of a circuit board, the method comprising the steps of:
disposing a sag support in an interior heating region of an inline pass through oven;
positioning the sag support with respect to the circuit board to prevent a first area of the circuit board from sagging with respect to a second area of the circuit board;
moving the circuit board through the interior heating region of the inline pass through oven using a transfer system;
using the sag support to prevent sagging of the circuit board as the transfer system moves the circuit board through the interior heating region of the inline pass through oven, the step of positioning occurring in the inline pass through oven, the sag support used to prevent sagging without using the sag support to actively move the circuit board through the oven.

14. The method of claim 13, further comprising the steps of:
providing a first support mount and a second support mount;
coupling the first support mount to a first surface that is fixed with respect to the circuit board;
coupling the second support mount to a second surface that is fixed with respect to the circuit board;
coupling the sag support to the first support mount and to the second support mount to position the sag support with respect to the circuit board to prevent the first area of the circuit board from sagging with respect to the second area of the circuit board.

15. The method of claim 14, further comprising the step of:
using at least one frame to provide the first surface and the second surface.

16. The method of claim 15, further comprising the step of:
forming at least one of the support mounts using a support base and a tensioner coupled to the support base;
fixing the at least one support mount to the at least one frame by fixing the support base to the at least one frame;
coupling the sag support to the at least one support mount by coupling the sag support to the tensioner.

17. The method of claim 14, further comprising the steps of:
forming at least one of the support mounts using a support base and a tensioner coupled to the support base;
fixing the at least one support mount to at least one of the first surface and the second surface by fixing the support base to the at least one of the first surface and the second surface;
coupling the sag support to the at least one support mount by coupling the sag support to the tensioner wherein the tensioner maintains tension on the sag support.

18. The method of claim 13, wherein the sag support comprises blued spring steel.

19. The method of claim 13, wherein the sag support has a width of about 0.01 inch.

20. The method of claim 13, wherein the sag support has a height of about 1 inch.

* * * * *